(12) United States Patent
Scholz et al.

(10) Patent No.: US 9,203,204 B2
(45) Date of Patent: Dec. 1, 2015

(54) OPTICAL FREQUENCY MULTIPLICATION

(71) Applicant: TOPTICA Photonics AG, Gräfelfing (DE)

(72) Inventors: Matthias Scholz, München (DE); Waldemar Weber, München (DE)

(73) Assignee: TOPTICA Photonics AG, Gräfelfing (DE)

( * ) Notice: Subject to any disclaimer, the term of this patent is extended or adjusted under 35 U.S.C. 154(b) by 0 days.

(21) Appl. No.: 14/515,662

(22) Filed: Oct. 16, 2014

(65) Prior Publication Data
US 2015/0110138 A1 Apr. 23, 2015

(30) Foreign Application Priority Data
Oct. 17, 2013 (DE) .......................... 10 2013 017 227

(51) Int. Cl.
H01S 3/10 (2006.01)
H01S 3/00 (2006.01)
H01S 3/109 (2006.01)
H01S 3/108 (2006.01)
H01S 3/13 (2006.01)
H01S 5/00 (2006.01)
H01S 5/068 (2006.01)
H01S 5/0687 (2006.01)

(52) U.S. Cl.
CPC ............... *H01S 3/0092* (2013.01); *H01S 3/108* (2013.01); *H01S 3/109* (2013.01); *H01S 3/13* (2013.01); *H01S 3/1303* (2013.01); *H01S 5/0092* (2013.01); *H01S 5/068* (2013.01); *H01S 5/0687* (2013.01)

(58) Field of Classification Search
CPC ....... H01S 3/109; H01S 3/108; H01S 3/0092; H01S 3/13; H01S 3/1303; H01S 5/0092; H01S 5/068; H01S 5/0787
USPC ................................ 372/22, 21, 32, 29.02, 33
See application file for complete search history.

(56) References Cited

U.S. PATENT DOCUMENTS 5,963,359 A * 10/1999 Shinozaki et al. ............. 359/326
2011/0243161 A1* 10/2011 Tucker et al. .................. 372/21

OTHER PUBLICATIONS

Dubé et al., "Thermally induced self-locking of an optical cavity by overtone absorption in acetylene gas," Journal of the Optical Society of America B, vol. 13, No. 9, Sep. 1996, pp. 2041-2054.

* cited by examiner

*Primary Examiner* — Kinam Park
(74) *Attorney, Agent, or Firm* — Collard & Roe, P.C.

(57) ABSTRACT

An apparatus for generating laser radiation at a frequency multiplied as compared with a base frequency, has an optical resonator, in which input laser radiation circulates resonantly at the base frequency, and at least one conversion element through which the input laser radiation circulating in the optical resonator radiates, and which converts this radiation, at least in part, into output laser radiation at the multiplied frequency. At least one compensation element is provided, through which the input laser radiation circulating in the optical resonator also radiates, and which absorbs this radiation, in part, wherein the compensation element balances out a temperature-dependent variation of the optical path length of the input laser radiation in the conversion element, at least in part. Furthermore, a system generates laser radiation.

6 Claims, 5 Drawing Sheets

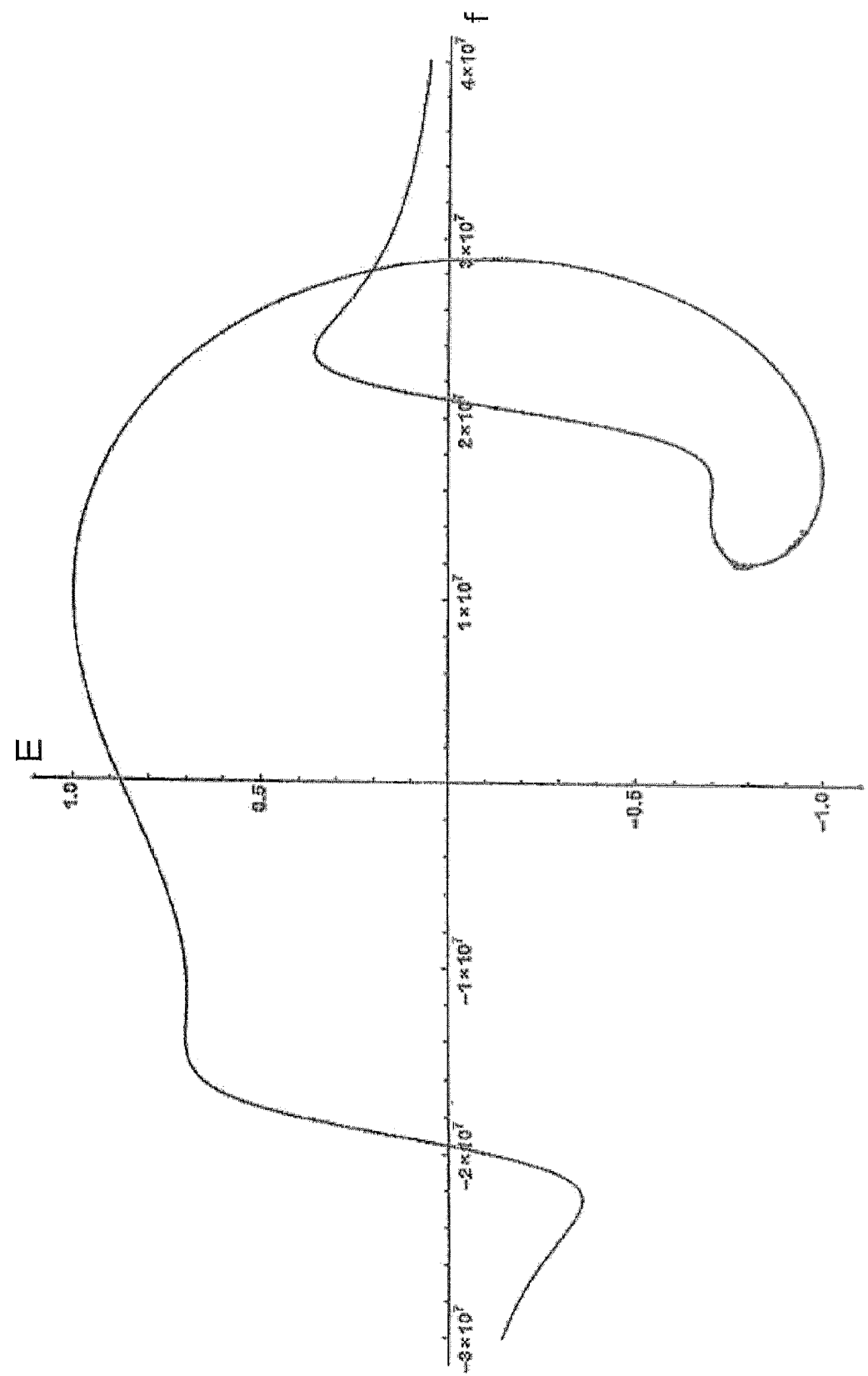

OPTICAL FREQUENCY MULTIPLICATION

CROSS REFERENCE TO RELATED APPLICATIONS

Applicant claims priority under 35 U.S.C. §119 of German Application No. 10 2013 017 227.6 filed Oct. 17, 2013, the disclosure of which is incorporated by reference.

BACKGROUND OF THE INVENTION

1. Field of the Invention

The invention relates to an apparatus for generating laser radiation at a frequency that is multiplied as compared with a base frequency, having an optical resonator, in which input laser radiation circulates resonantly at the base frequency, and having at least one conversion element through which the input laser radiation that circulates in the optical resonator radiates and which converts this radiation, at least in part, into output laser radiation at the multiplied frequency. Furthermore, the invention relates to a system for generating laser radiation.

2. Description of the Related Art

The basic principle of frequency multiplication using non-linear optics is sufficiently known. In this connection, the laser radiation present at a base frequency (input laser radiation) is converted to laser radiation (output laser radiation), using a non-linear optical medium as a conversion element, at a frequency that is a whole-number multiple of the base frequency. A prerequisite for this conversion is that the non-linear optical medium of the conversion element has a susceptibility of a higher order. The frequency conversion based on this principle finds broad application. Frequently, solid-body lasers that can be produced in simple and cost-advantageous manner and emit in the infrared spectral range are used, in order to generate laser radiation in the visible or ultraviolet spectral range by means of frequency multiplication. Suitable non-linear optical media are commercially available in the form of crystals, for example.

The efficiency of the frequency conversion is greatly dependent on the intensity of the input laser radiation. In order to obtain the most intensive output laser radiation possible at the multiplied frequency, an optical resonator is therefore frequently used to super-elevate the intensity of the input laser radiation. The conversion element is then situated within the resonator, i.e. the input laser radiation that circulates in the resonator, i.e. is resonantly super-elevated, radiates through the non-linear medium.

A disadvantage is the power and mode stability in the generation of frequency-multiplied laser radiation, which is difficult to achieve, using a conversion element situated in the resonator. Already because of the non-linear relationship between the intensity of the input laser radiation and the efficiency of the frequency conversion, power oscillations and competing resonator modes can occur, which are difficult to stabilize.

At higher power, a further difficulty is that the absorption of the laser radiation in the optical resonator leads to a shift in the resonance frequencies due to thermal effects. In the non-linear conversion element, a significant part of the circulating laser radiation is absorbed by the crystal at high power, and is thereby converted to output radiation, for one thing, and to heat, for another. As a consequence, the temperature of the non-linear medium changes. Because of thermal expansion, the geometric length of the non-linear medium changes. Furthermore, the index of refraction of the non-linear medium is temperature-dependent. In total, the optical path length of the laser radiation radiating through the conversion element therefore varies in temperature-dependent manner. The optical path length in the conversion element determines the efficiency of the frequency conversion. Consequently, the thermal variation of the optical path length in turn results in a variation of the absorption of the input laser radiation. This variation makes resonant frequency multiplication at high power practically impossible to stabilize.

The phenomena described above will be explained below using FIGS. 1 and 2. FIGS. 1a and 2a each show an error signal E of a Pound-Drever-Hall regulator (PDH regulator) at a power of the input laser radiation circulating in an optical resonator of 1 W (FIG. 1) or 40 W (FIG. 2), for example. In the diagrams of FIGS. 1a and 2a, the error signal E is shown as a function of the frequency f, in each instance. FIGS. 1b and 2b each show the resonance curve of the optical resonator (also referred to as an Airy function). What is shown is the intensity I of the circulating laser radiation as a function of the laser frequency f. As FIG. 1 shows, the curves are symmetrical at low circulating power, and a clear relationship exists between error signal E or intensity I and frequency f. Stabilization of the resonator is possible by means of suitable regulation. The high circulating power and the thermally induced variation in the absorption of the input laser radiation in the non-linear conversion element situated in the resonator, caused by this power, brings about the distortion in the Airy function that can be seen in FIG. 2b. The normally symmetrical resonance curve is inclined at a strong slant. The curve shows that no clear relationship exists between intensity I and frequency f. At a given laser frequency f, the intensity I of the laser radiation can assume up to three different values. The system jumps chaotically between these simultaneously allowed states of the resonator, at the slightest interference. Accordingly, stable operation is not possible. This situation is shown by the diagram in FIG. 2a. The error signal E of the PDH regulator can assume up to three different values at one laser frequency. The signal jumps chaotically between these values, so that the PDH regulator is not able to stabilize the optical resonator.

The diagrams of FIGS. 1 and 2 show simulation calculations. In this connection, the starting point was a power of 1 W or 40 W, respectively, circulating in the resonator, as has already been mentioned. A β-barium borate crystal having a length of 20 mm was assumed to be the conversion element. At the same time, a typical absorption of 30 ppm per centimeter was assumed in the crystal. The finesse of the resonator amounts to 250 in the simulation calculation.

The instabilities of optical resonators described above, induced by temperature dependence, in which resonators absorption occurs, are known from the state of the art in a different connection (see, for example, Journal of the Optical Society of America B, Vol. 13, Number 9, pages 2041 ff).

SUMMARY OF THE INVENTION

Against this background, it is the task of the invention to provide an apparatus for generating laser radiation at a frequency that is multiplied as compared with a base frequency, which apparatus can be well stabilized at high power of the laser radiation circulating in the resonator, and with great finesse of the resonator.

This task is accomplished by the invention, proceeding from an apparatus of the type stated initially, in that at least one compensation element is provided, through which the input laser radiation that circulates in the optical resonator radiates and which partly absorbs this radiation, wherein the compensation element balances out a temperature-dependent variation of the optical path length of the input laser radiation in the conversion element, at least in part.

It is the core idea of the invention to introduce an additional element aside from the non-linear optical conversion element, namely the compensation element, into the resonator, whereby the input laser radiation circulating in the optical resonator also radiates through the compensation element and partly absorbs this radiation. This absorption leads to heating of the compensation element. Accordingly, the optical path length of the input laser radiation in the compensation element is temperature-dependent. The input laser radiation that radiates through not only the compensation element but also the conversion element thereby induces a temperature-dependent variation of the optical path length not only in the compensation element but also in the conversion element, in each instance.

According to the invention, the compensation element is configured in such a manner that it balances out the temperature-dependent variation of the optical path length in the conversion element, at least in part. In this connection, the temperature dependence of the optical path length change of the compensation element is selected or designed, in targeted manner, in such a manner, for example, that an optical path length in the conversion element increased as the result of heating is balanced out, at least in part, by means of a reduced optical path length of the input laser radiation in the compensation element. Vice versa, an optical path length of the input laser radiation in the conversion element reduced as the result of thermal influences brings about an increased optical path length of the input laser radiation in the compensation element, in terms of tendency.

The thermal changes in the optical properties brought about by the absorption of the input laser radiation in the conversion element, on the one hand, and in the compensation element, on the other hand, which have an effect on the resonance behavior of the optical resonator, are directed counter to one another according to the invention, to put it a different way, and accordingly balance one another out, at least in part.

The result is that the apparatus according to the invention permits significantly greater circulating power of the input laser radiation as compared with the state of the art, until the thermal influences mentioned make stabilization of the resonator impossible. Because the power of the frequency-multiplied output laser radiation depends on the power of the input laser radiation in the resonator, according to a potency law, the invention makes it possible to disproportionately increase the power of the output laser radiation. In the case of frequency doubling, tripling of the circulating power of the input laser radiation, for example, brings about a nine-times increase in the power of the frequency-doubled output laser radiation.

The conversion element introduced into the resonator, according to the invention, reduces the finesse of the resonator only minimally. This reduction can easily be accepted.

In a preferred embodiment of the apparatus according to the invention, the conversion element and the compensation element are non-linear optical crystals. In this connection, it is practical if the conversion element and the compensation element consist of the same material. For example, the conversion element and the compensation element can be β-barium borate crystals. In this connection, the length of the compensation element can be adapted to the length of the conversion element, for optimal compensation.

β-barium borate is particularly well suited as a conversion element. β-barium borate crystals are commercially available in a suitable quality.

The thermal effects described, of a change in the optical path length in a non-linear optical crystal, which effects, as already mentioned above, can impair the stabilization of a resonator, depend on the power of the input laser radiation P circulating in the resonator, and on the temperature dependence of the optical path length in the conversion element. This dependence can be expressed by a "Figure of Merit" (FOM). The following formula applies for this relationship:

$$FOM = P(\alpha_T n + dn/dT)L$$

In this connection, n is the index of refraction of the material of the conversion element; $\alpha_T$ is the thermal length expansion coefficient of the material of the conversion element; dn/dT is the thermo-optical coefficient, which indicates the temperature dependence of the index of refraction n; and L is the geometrical length of the non-linear optical crystal, i.e. the geometrical length of the radiation path of the input laser radiation through the crystal. The parameters $\alpha_T$ and dn/dT are material parameters. According to the invention, advantage is taken of the ability to find a compensation element, the material parameters of which bring about a temperature dependence according to the above formula, directed counter to the FOM of the compensation element.

In other words, according to the invention the compensation element can have a temperature-dependent variation of the optical path length of the input laser radiation that radiates through the compensation element, which length is directed counter to the temperature-dependent variation of the optical path length of the input laser radiation that radiates through the conversion element.

For example, crystals can be used that have different length expansion coefficients or different thermo-optical coefficients along different crystal axes. In this case, the crystals must be oriented in the beam path in such a manner that the input laser radiation radiates through them in a suitable direction, differently relative to the crystal axes, in each instance. This requirement means, in other words, that the input laser radiation encloses different angles with the crystal axes of the conversion element than with the crystal axes of the compensation element. Once again, a material suitable in this sense is β-barium borate, which has a trigonal crystal structure with different length expansion coefficients along the different crystal axes.

In a preferred embodiment of the apparatus according to the invention, the conversion element is phase-adapted, while the compensation element is not phase-adapted. In order for the output laser radiation generated in the conversion element to actually be emitted, it is known that the phase adaptation condition must be met. In this case, the phase adaptation condition determines the orientation of the conversion element, in other words of the non-linear optical crystal, in the beam path. This situation does not hold true for the compensation element. In the case of the compensation element, the phase adaptation condition does not need to be met, and actually should not be met, in order not to additionally reduce the power of the input laser radiation. The non-linear crystal of the compensation element is not intended for generating frequency-multiplied output laser radiation. With regard to the compensation element, the freedom therefore exists of selecting an orientation of the non-linear optical crystal in the beam path, which orientation is optimal for the function of the compensation element in the sense of the invention.

In another preferred embodiment of the apparatus according to the invention, a regulator is provided, which stabilizes the optical resonator with regard to the base frequency. A PDH regulator of the usual type is suitable for this.

The invention furthermore relates to a system for generating laser radiation, having a laser that generates input laser radiation at a base frequency, an optical resonator in which the input laser radiation circulates resonantly, and a first non-linear optical crystal through which the input laser radiation that circulates in the optical resonator radiates and which converts this radiation, at least in part, into output laser radiation at a frequency multiplied with regard to the base frequency, whereby a second non-linear optical crystal is provided, which also has the input laser radiation circulating in the optical resonator radiating through it, and absorbs this radiation, in part, whereby the first non-linear optical crystal is phase-adapted and the second non-linear optical crystal is not phase-adapted. The laser can be a pulsed laser, for example a mode-coupled laser that generates ultra-short laser pulses, or also a continuous beam laser. The system according to the invention is particularly well suited for generating output laser radiation in the ultraviolet spectral range by means of frequency doubling, whereby the power of the output laser radiation can amount to 100 mW or more. Such high UV power can be generated in stable manner, according to the invention, with conventional resonator stabilization, over extended periods of time.

BRIEF DESCRIPTION OF THE DRAWINGS

Exemplary embodiments of the invention will be explained in greater detail in the following, using the drawings. These show:

FIGS. 2A and 2B show the PDH error signal and resonance curve of a simulated optical resonator of a conventional type with conversion element at a circulating power of 40 W;

DETAILED DESCRIPTION OF PREFERRED EMBODIMENTS

Figure 1A:
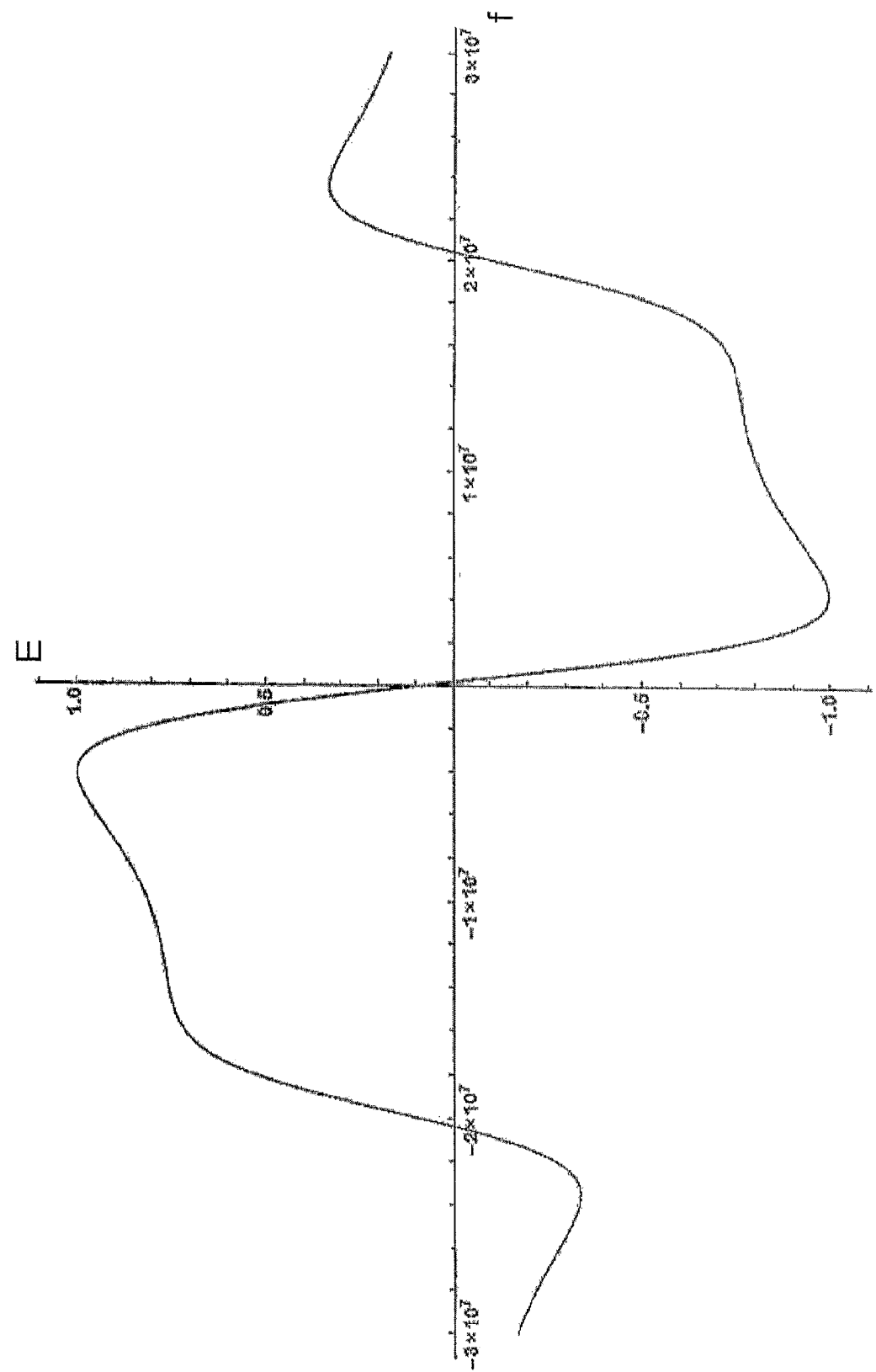
FIGS. 1A and 1B show the PDH error signal and resonance curve of a simulated optical resonator of a conventional type with conversion element at a circulating power of 1 W.
Figure 1B:
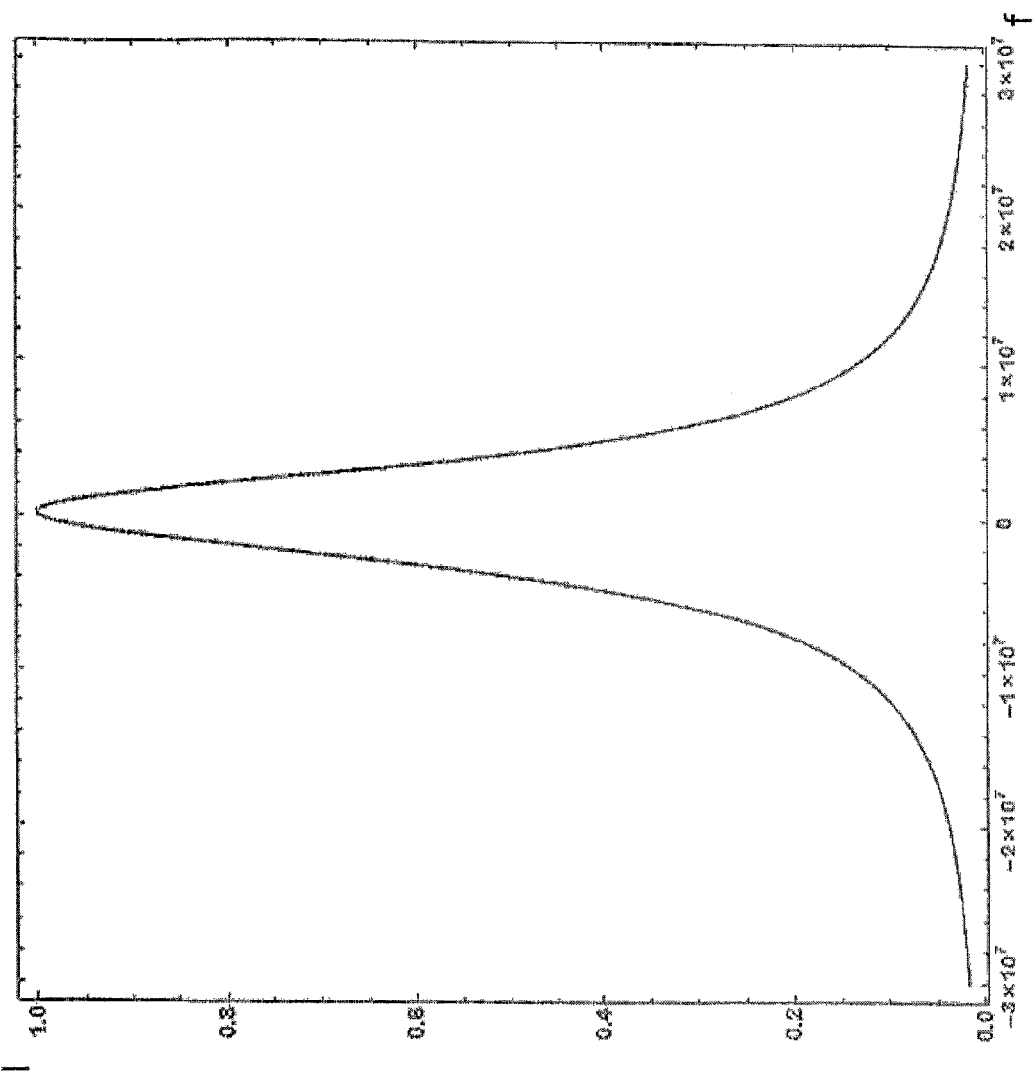
Figure 2B:
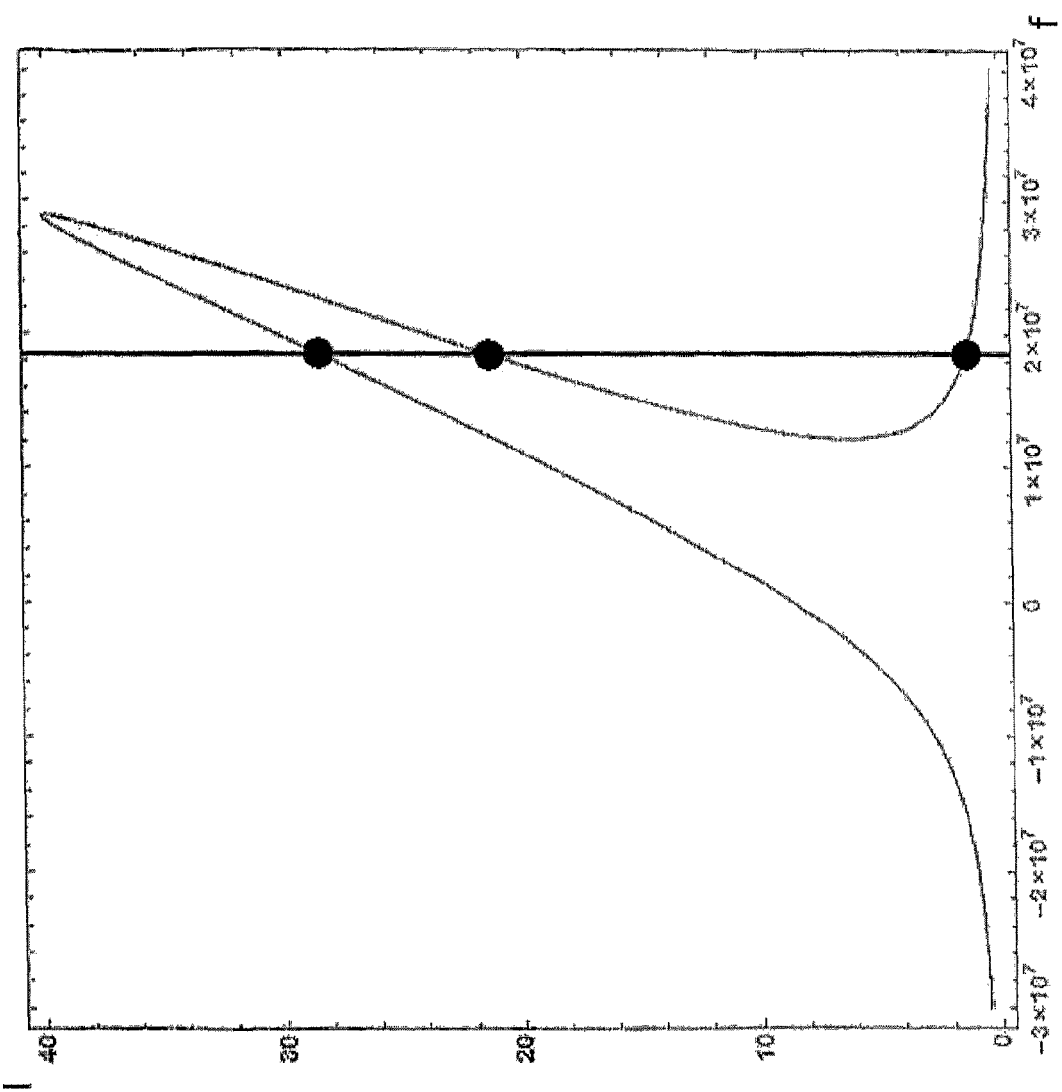

FIGS. 1 and 2 show, in FIGS. 1a and 2a, respectively, a PDH error signal E of a conventional optical resonator at low and high circulating power, respectively, of the input laser radiation as a function of the laser frequency f, whereby the input laser radiation is partially converted, by means of frequency conversion, by a non-linear optical crystal situated in the resonator. FIGS. 1b and 2b show the related resonance curve of the resonator (intensity I as a function of the frequency f), in each instance. Reference is made to the above explanations in this regard.

Figure 3:
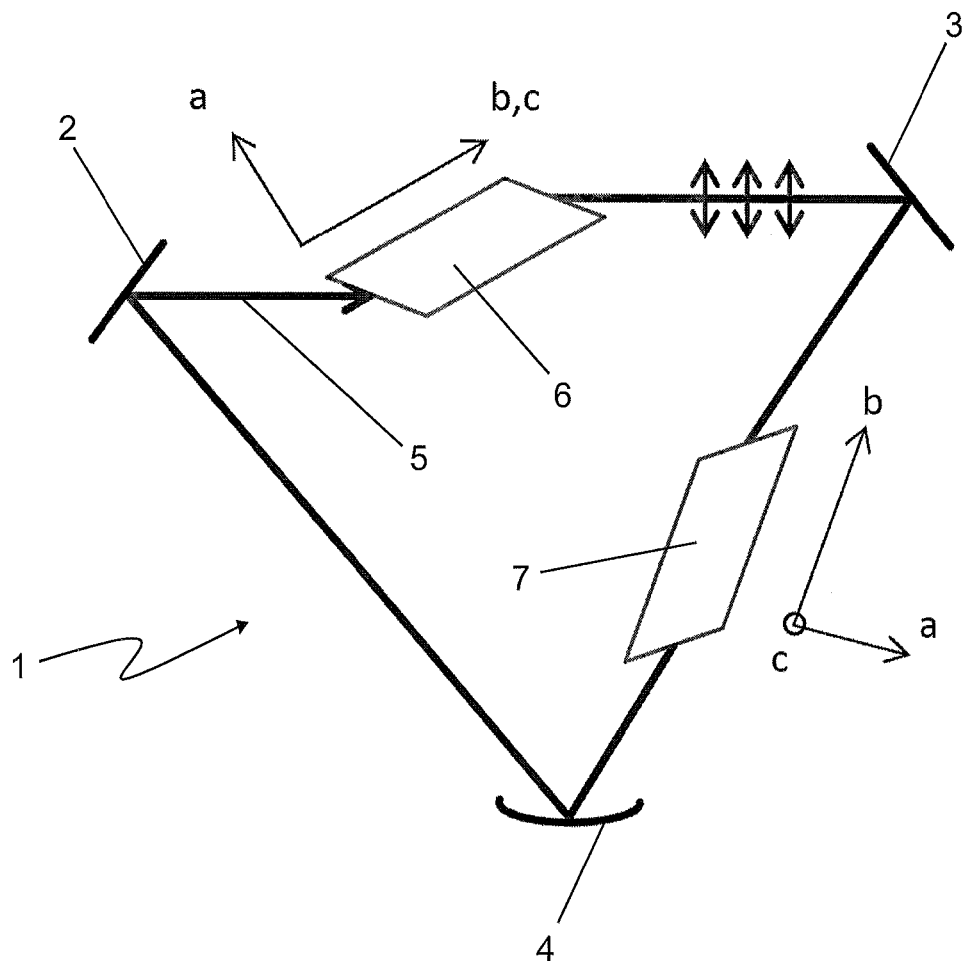
FIG. 3 shows an apparatus according to the invention with an optical resonator, conversion element, and compensation element.

FIG. 3 shows an optical resonator, indicated as a whole with the reference number 1. This resonator comprises three mirrors 2, 3, and 4, of which the mirror 4 is configured as a spherical mirror. The mirror 2 can be used as an input coupler for coupling in the input laser radiation circulating in the resonator 1, while the mirror 3 serves as an output coupler for coupling out the frequency-multiplied output laser radiation.

The input laser radiation circulating in the resonator 1 is indicated with the reference number 5. In the beam path of the resonator 1, there is a non-linear optical crystal as a conversion element 6, namely a β-barium borate crystal. The input laser radiation 5 radiates through this crystal, and the crystal converts the radiation, in part, into frequency-multiplied output laser radiation. The β-barium borate crystal of the conversion element 6 is phase-adapted.

The position of the crystal axes a, b, c of the trigonal crystal is indicated in FIG. 3. Within the crystal of the conversion element 6, the radiation lies in the plane spanned by the crystal axes b and c. The radiation runs at an angle of approx. 45° relative to the optical axis of the double-refraction crystal. The incident input laser radiation 5 is regularly polarized.

In this arrangement, the following parameters apply: The length expansion coefficient $\alpha_T$ amounts to approximately 20 ppm per Kelvin, the thermo-optical coefficient dn/dT amounts to −16.6 ppm per Kelvin. Therefore, according to the above formula, a value of +13.5 ppm per Kelvin is obtained for the FOM, under the assumption of an effective crystal length of 20 mm and a power of the input laser radiation circulating in the resonator of 40 W. According to the invention, a compensation element 7 is furthermore situated in the resonator 1, through which element the input laser radiation 5 circulating in the resonator 1 radiates, and which element partially absorbs this radiation. The compensation element 7 balances out a temperature-dependent variation of the absorption of the input laser radiation in the conversion element 6, at least in part.

For this purpose, the compensation element 7 in the exemplary embodiment shown is another β-barium borate crystal. The position of the crystal axes in the beam path deviates from that of the conversion element 6 in the case of the compensation element 7. The position of the crystal axes is indicated in FIG. 2.

The conversion element 6 is phase-adapted, while the compensation element 7 is not phase-adapted. As can be seen, the radiation spreads out in the compensation element 7 parallel to the b axis of the crystal.

In this connection, the polarization lies along the a axis, so that once again, regular polarization of the input laser radiation 5 is present. For the b axis of the crystal, the thermal length expansion coefficient $\alpha_T$ lies at approximately 4 ppm, so that here, an FOM of approximately −7.9 ppm per Kelvin is obtained.

With regard to the thermo-optical coefficient, the conversion element 6 and the compensation element 7 agree with one another. From this agreement, it can be recognized that the compensation element 7 has a temperature-dependent variation of the optical path length, which is directed counter to the temperature-dependent variation of the optical path length in the conversion element 6. By means of the combination of conversion element 6 and compensation element 7, the instabilities that occur in the resonator 1 as the result of absorption are reduced. At great finesse of the resonator, the invention accordingly allows a circulating power of the input laser radiation 5 that is higher by a multiple, as compared with the state of the art, before the thermally induced instabilities occur and can no longer be compensated. The result is, accordingly, a disproportionately increased power of the frequency-multiplied output laser radiation.

Figure 4:
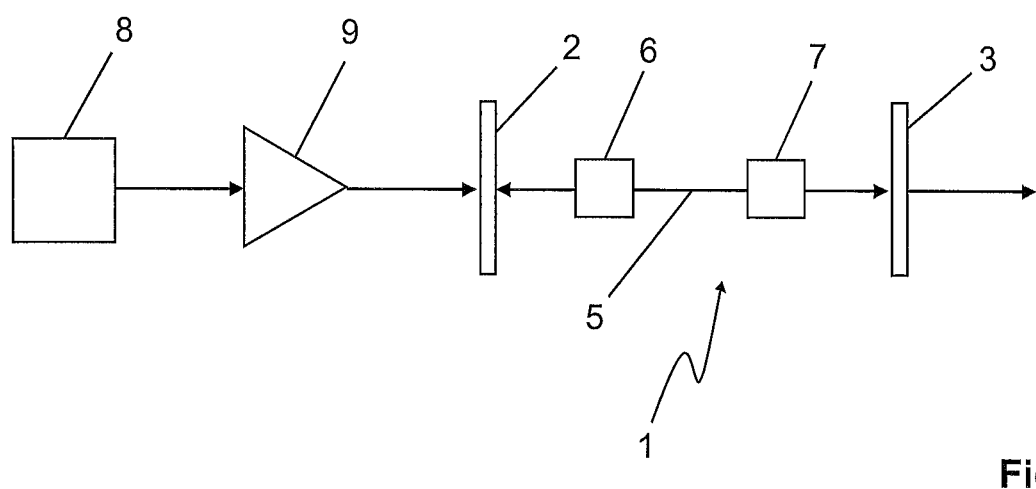
FIG. 4 is a block schematic of a system according to the invention.

FIG. 4 shows a system according to the invention as a block schematic. The system comprises a laser 8 that generates the input laser radiation at the base frequency. Following the laser 8 is an optical amplifier 9, to obtain the desired power. The input laser radiation 5 amplified in this way is coupled into the resonator 1. The resonator 1 is shown in FIG. 4 as a Fabry-Perot cavity. In the resonator 1, there is a first non-linear optical crystal (β-barium borate) 6, which serves as a conversion element in the manner described above. Accordingly, the first non-linear optical crystal is phase-adapted. Furthermore, there is a second non-linear optical crystal (β-barium borate) 7 in the resonator 1 as a compensation element. The latter is not phase-adapted. Furthermore, the system has a PDH regulator (not shown), which stabilizes the optical resonator 1 with regard to the base frequency.

Although only a few embodiments of the present invention have been shown and described, it is to be understood that many changes and modifications may be made thereunto without departing form the spirit and scope of the invention.

What is claimed is:

1. An apparatus for generating laser radiation at a frequency multiplied as compared with a base frequency, comprising
   (a) an optical resonator, in which input laser radiation (5) circulates resonantly at the base frequency;
   (b) at least one conversion element through which the input laser radiation circulating in the optical resonator radiates, wherein the at least one conversion element converts the input laser radiation, at least in part, into output laser radiation at the multiplied frequency; and
   (c) at least one compensation element, through which the input laser radiation circulating in the optical resonator also radiates, wherein the at least one compensation element absorbs the input laser radiation, in part, and balances out a temperature-dependent variation of an optical path length of the input laser radiation in the at least one conversion element, at least in part;
   wherein the at least one conversion element and the at least one compensation element are non-linear optical crystals;
   wherein the at least one conversion element and the at least one compensation element comprise the same material;
   wherein the input laser radiation radiates through the at least one conversion element and the at least one compensation element from different directions, relative to crystal axes of the non-linear optical crystals; and
   wherein the at least one compensation element has a first temperature-dependent variation of an optical path length of the input laser radiation that radiates through the at least one compensation element, wherein the first temperature-dependent variation is directed counter to a second temperature-dependent variation of the optical path length of the input laser radiation that radiates through the at least one conversion element.

2. The apparatus according to claim 1, wherein the at least one conversion element and the at least one compensation element are β-barium borate crystals.

3. The apparatus according to claim 1, wherein the at least one conversion element is phase-adapted and the at least one compensation element is not phase-adapted.

4. The apparatus according to claim 1, further comprising a regulator that stabilizes the optical resonator with regard to the base frequency.

5. A system for generating laser radiation, comprising
   (a) a laser that generates input laser radiation at a base frequency;
   (b) an optical resonator in which the input laser radiation circulates resonantly;
   (c) a first non-linear optical crystal through which the input laser radiation circulating in the optical resonator radiates, wherein the first non-linear optical crystal converts the input laser radiation, at least in part, into output laser radiation at a frequency multiplied as compared with the base frequency; and
   (d) a second non-linear optical crystal through which the input laser radiation circulating in the optical resonator also radiates, wherein the second non-linear optical crystal partly absorbs the input laser radiation, and wherein the first non-linear optical crystal is phase-adapted and the second non-linear optical crystal is not phase-adapted;
   wherein at least one conversion element and at least one compensation element are non-linear optical crystals;
   wherein the at least one conversion element and the at least one compensation element comprise the same material;
   wherein the input laser radiation radiates through the at least one conversion element and the at least one compensation element from different directions, relative to crystal axes of the non-linear optical crystals; and
   wherein the at least one compensation element has a first temperature-dependent variation of an optical path length of the input laser radiation that radiates through the at least one compensation element, wherein the first temperature-dependent variation is directed counter to a second temperature-dependent variation of the optical path length of the input laser radiation that radiates through the at least one conversion element.

6. The system according to claim 5, wherein the output laser radiation has a frequency that lies in the ultraviolet spectral range and a power amounting to at least 100 mW.

* * * * *